(12) United States Patent
Canac

(10) Patent No.: US 8,258,775 B2
(45) Date of Patent: Sep. 4, 2012

(54) METHOD AND APPARATUS FOR DETERMINING PHASE ERROR BETWEEN CLOCK SIGNALS

(75) Inventor: Vanessa S. Canac, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 594 days.

(21) Appl. No.: 12/424,176

(22) Filed: Apr. 15, 2009

(65) Prior Publication Data

US 2010/0264903 A1   Oct. 21, 2010

(51) Int. Cl.
*G01R 25/00* (2006.01)

(52) U.S. Cl. ....... 324/76.77; 327/20; 327/158; 327/194; 375/371

(58) Field of Classification Search ................ 324/76.77
See application file for complete search history.

(56) References Cited

U.S. PATENT DOCUMENTS

| | | | | |
|---|---|---|---|---|
| 4,604,582 A * | 8/1986 | Strenkowski et al. | ........ | 327/147 |
| 4,618,787 A * | 10/1986 | Jacksier et al. | ................ | 327/262 |
| 4,721,905 A * | 1/1988 | Mehrgardt | ................ | 324/76.82 |
| 5,384,552 A * | 1/1995 | Iwasaki | ............................ | 331/25 |
| 5,442,315 A * | 8/1995 | Hutchins | ........................ | 327/159 |
| 5,663,942 A | 9/1997 | Ishibashi et al. | | |
| 5,768,291 A * | 6/1998 | Kelton et al. | .................. | 714/746 |
| 6,008,671 A * | 12/1999 | Kang | ............................. | 327/20 |
| 6,479,978 B1 * | 11/2002 | Aliahmad et al. | ......... | 324/76.77 |
| 6,528,982 B1 * | 3/2003 | Yanagisawa et al. | ...... | 324/76.77 |
| 6,657,467 B2 * | 12/2003 | Seki et al. | ...................... | 327/158 |
| 6,763,079 B1 * | 7/2004 | Iwamoto | ........................ | 375/376 |
| 6,859,106 B2 * | 2/2005 | Sano | ............................. | 331/1 A |
| 6,903,582 B2 | 6/2005 | Gaskins et al. | | |
| 7,288,998 B2 * | 10/2007 | Thomsen et al. | ............... | 331/16 |
| 7,498,848 B2 | 3/2009 | Wadhwa et al. | | |
| 7,557,561 B2 * | 7/2009 | Awaji et al. | ................. | 324/76.77 |
| 7,821,249 B2 * | 10/2010 | Nose et al. | .................. | 324/76.77 |
| 2002/0199124 A1 * | 12/2002 | Adkisson | ...................... | 713/400 |
| 2003/0001637 A1 * | 1/2003 | Jung | ............................ | 327/158 |
| 2006/0098771 A1 * | 5/2006 | Cafaro et al. | .................. | 375/371 |
| 2006/0119402 A1 * | 6/2006 | Thomsen et al. | ............. | 327/105 |
| 2006/0119437 A1 * | 6/2006 | Thomsen et al. | ............... | 331/10 |
| 2008/0001637 A1 | 1/2008 | Chen et al. | | |
| 2008/0003953 A1 * | 1/2008 | Ke et al. | .......................... | 455/76 |
| 2008/0013664 A1 | 1/2008 | Wang | | |
| 2008/0123445 A1 * | 5/2008 | Vergnes et al. | ................ | 365/194 |
| 2008/0246520 A1 * | 10/2008 | Ma et al. | ........................ | 327/158 |
| 2009/0033391 A1 * | 2/2009 | Vergnes et al. | ................ | 327/161 |
| 2009/0097605 A1 * | 4/2009 | Farjad-Rad | ................... | 375/373 |
| 2010/0109641 A1 * | 5/2010 | Noda et al. | .................. | 324/76.77 |

* cited by examiner

*Primary Examiner* — Timothy J Dole
*Assistant Examiner* — Benjamin M Baldridge
(74) *Attorney, Agent, or Firm* — Gary R. Stanford; James W. Huffman

(57) ABSTRACT

A phase error circuit including phase difference logic and delay and register logic. The phase difference logic provides a pulse difference signal including at least one difference pulse indicative of a timing difference between selected edges of a pair of clock signals. The delay and register logic receives the pulse difference signal and provides a phase error value representing phase error between the clock signals. The delay and register logic may include a delay line with multiple delay cells and taps coupled in series in which each tap provides an output state of a delay cell. The register logic registers a state of each tap to provide delay bits in response to each trailing edge of the difference pulses. Each delay bit may remain set until reset so that the longest pulse difference signal is registered to provide the peak phase error.

21 Claims, 5 Drawing Sheets

METHOD AND APPARATUS FOR DETERMINING PHASE ERROR BETWEEN CLOCK SIGNALS

BACKGROUND OF THE INVENTION

1. Field of the Invention

The present invention relates to clock synchronization and clock domain crossing, and more particularly to determining peak phase error between clock signals provided to different clock domains.

2. Description of the Related Art

Integrated circuit design continues to advance as increased functionality is packed into shrinking circuit configurations. Different clock frequencies are used to maximize circuit efficiency for disparate circuit functions. A typical microprocessor, for example, has different clock frequencies for different circuits within different clock domains, such as a processor clock, and input/output (I/O) clock, a core clock, a bus clock, a quad-pumped clock, etc. Information must be successfully transferred between different clock domains for proper chip operation. Clock domain crossing occurs when data or information generated by a circuit within a first clock domain driven by a first clock having a first frequency is transferred to or otherwise captured by a circuit within a second clock domain driven by a second clock with a second, different frequency. In many configurations, the disparate clock frequencies are derived from a common reference clock. Multiple phase-locked loop (PLL) circuits are used to multiply the frequency of a reference clock to generate the desired clock signals based on respective clock multipliers as understood by those skilled in the art. Ideally each PLL circuit produces a higher frequency clock signal synchronized with the reference clock within an acceptable tolerance range. As long as the clocks are synchronized within the acceptable tolerance range, such as, for example, within one-half cycle of the faster clock signal, data and information can be successfully transferred between circuits within different clock domains.

Marginal or even improper PLL circuit design may, however, jeopardize successful clock domain crossing causing failure of operation. Also, although a properly designed PLL circuit may function properly for most conditions, circuit variations and environmental conditions, such as voltage, temperature, speed, input jitter, etc., may result in improper operation and/or circuit failure. It is desired to quantify peak phase error between different clock signals derived from a common reference clock signal. The measured phase error during test identifies potential problems and enables circuit adjustment to resolve potential timing problems to achieve desired performance and operation. PLL circuits, for example, may be adjusted to minimize phase error and ensure proper operation for expected environmental conditions and variations.

SUMMARY OF THE INVENTION

A phase error circuit according to one embodiment includes phase difference logic and delay and register logic. The phase difference logic provides a pulse difference signal including at least one difference pulse indicative of a timing difference between selected edges of a pair of clock signals. The delay and register logic has an input receiving the pulse difference signal and an output providing a phase error value representing phase error between the pair of clock signals. The delay and register logic may include a delay line including multiple delay cells and taps coupled in series in which each tap provides an output state of a corresponding delay cell. The register logic registers or otherwise latches a state of each tap as delay bits in response to each trailing edge of the difference pulses. Each delay bit may remain set until reset so that the longest pulse difference signal is registered to provide the peak phase error.

An integrated circuit according to one embodiment includes multiple clock circuits providing multiple clock signals and a phase error circuit. The phase error circuit includes phase difference logic, delay and register logic, and control logic. The phase difference logic receives a selected pair of clock signals and provides a pulse difference signal including a difference pulse indicative of a timing difference between the selected pair of clock signals. The delay and register logic has an input receiving the pulse difference signal and an output providing a phase error value representing peak phase error between the selected pair of clock signals. The control logic selects the pair of clock signals from among the multiple clock signals.

A method of measuring phase error between clock signals according to one embodiment includes logically comparing a pair of clock signals at selected clock edges and providing timing difference pulses, providing the timing difference pulses though delay line with multiple taps, registering a state of each of the taps to provide corresponding delay bits at the end of each timing difference pulse, in which each delay bit that is set remains set until cleared, and converting the delay bits to a phase error value.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present inventor has observed that significant variation between disparate clock signals results in improper operation. The disadvantages include, for example, improper data transfer across clock boundaries between different clock domains. She has therefore developed a method and apparatus for quantifying peak phase error between clock domains, as will be further described below with respect to FIGS. 1-6. The test results are used to identify potential timing problems and to determine appropriate adjustments of timing circuits to ensure proper circuit operation. Such adjustments may include, for example, adjustments of adaptive PLLs, blowing of selected fuses, etc.

Figure 1:
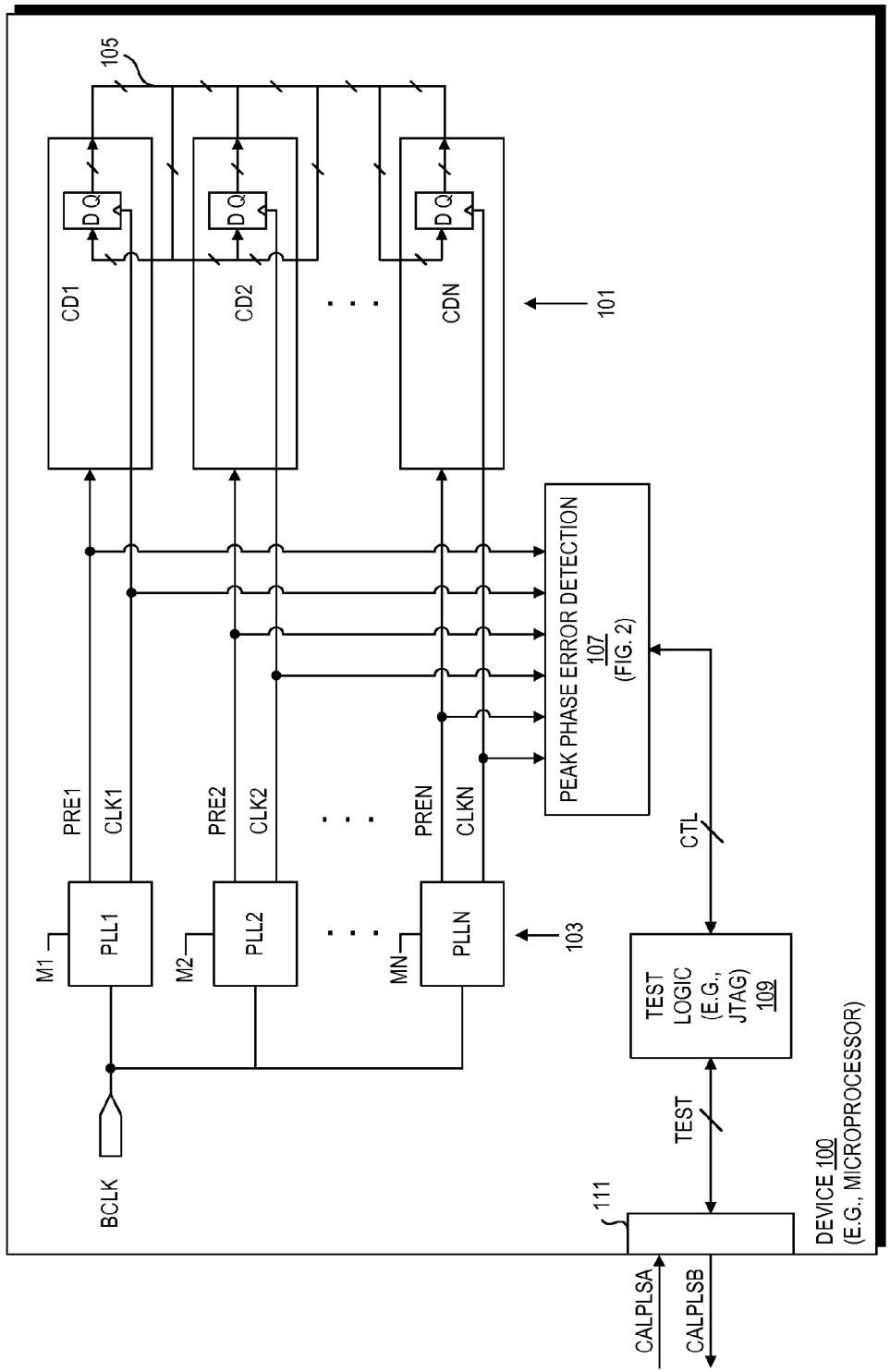
FIG. 1 is a simplified block diagram of an integrated device implemented according to one embodiment.

FIG. 1 is a simplified block diagram of an integrated device 100 implemented according to one embodiment. The device 100 is an integrated circuit (IC) or chip configured according to a selected device type, such as, for example, a microprocessor or the like. The device 100 includes a number "N" of different clock domains 101, individually labeled CD1, CD2, . . . , CDN (CD1-CDN), in which each clock domain 101 incorporates circuitry (not shown) for performing the various functions of the device 100. The number N is any suitable integer greater than 1 depending upon the relative complexity of the device 100. Each of the clock domains CD1-CDN is synchronized based on a respective one of N clock signals CLK1, CLK2, . . . , CLKN (CLK1-CLKN), in which each clock signal has a suitable or desired frequency for the circuitry of the respective clock domain 101. As shown, CLK1 is provided to clock domain CD1, CLK2 is provided to clock domain CD2, and so on up to CLKN, which is provided to the clock domain CDN. In the illustrated embodiment, the clock signals CLK1-CLKN are generated based on a primary or reference clock signal BCLK. The BCLK signal is generated by a clock circuit (not shown) on the chip or received or otherwise derived from an external clock input. BCLK is provided to the input of each of a number "N" of phase-locked loop (PLL) circuits 103, individually labeled PLL1, PLL2, . . . , PLLN (PLL1-PLLN), which develop the clock signals CLK1-CLKN, respectively, based on clock multipliers M1, M2, . . . , MN (M1-MN), respectively.

The clock multipliers M1-MN are stored using any suitable method or memory device, such as with fuses or with any type of random access memory (RAM) or read-only memory (ROM) device or the like. In one embodiment, any one or more of the clock multipliers M1-MN are dynamically programmable during normal operation of the device 100 in order to program the corresponding clock signals CLK1-CLKN to desired frequencies. Thus, for example, the clock multiplier M1 is programmed with the value 4 to operate CLK1 at 4 times the frequency of BCLK, and then reprogrammed with the value 32 to operate CLK1 at 32 times the frequency of BCLK, etc. Although the PLL circuits PLL1-PLLN are shown providing corresponding clock signals CLK1-CLKN to respective clock domains CD1-CDN, it is appreciated that two or more of the PLL circuits 103 may be used by the same circuitry. Although not shown, for example, any two of the PLL circuits 103 may be used to provide programmable clock frequencies to any one or more of the clock domains 101 with corresponding clock select logic (not shown). For example, while receiving CLK1 programmed by PLL1 at a first frequency, circuitry within CD1 programs M2 to provide CLK2 at a second frequency. When CLK2 stabilizes to the new frequency, CD1 switches from CLK1 to CLK2 to operate using the new frequency on CLK2. Then the circuitry can reprogram M1 while operating using CLK2.

The circuitry of any two or more of the clock domains CD1-CDN communicate with each other as illustrated by signal lines 105. Each of the clock domains CD1-CDN is shown including a register including any combination of internal registers and logic, in which a respective clock signal is provided as a clock input, input data is provided from the same or any one or more other clock domains, and output data is provided to the same or any one or more other clock domains. For example, data generated by clock domain CD1 operating using CLK1 is transferred to clock domain CD2 operating using CLK2, in which CLK1 and CLK2 are programmed at different frequencies. In order to successfully transfer data between different clock domains operating at different clock frequencies, it is desired that any phase error between the respective clock signals be within a predetermined tolerance level or range. In one embodiment, for example, successful data transfer occurs when the two clock signals have phase error of less than one-half cycle of the faster clock signal. Each of the PLL circuits 103 generates a corresponding one of multiple preliminary signals PRE1, PRE2, . . . PREN (PRE1-PREN) for a respective one of the clock signals CLK1-CLKN. Each preliminary signal PREi is asserted just prior to the next operative edge of the corresponding clock signal CLKi which is supposed to be coincident with a corresponding operative edge of the BCLK signal, in which "i" is an index value representing corresponding clock and preliminary signals. In one embodiment, the operative edge is a rising edge coincident with each rising edge of the BCLK signal. Each PLL circuit 103 operates to multiply the frequency of BCLK by its corresponding multiple Mi to provide a corresponding clock signal CLKi with as little phase error as possible between BCLK and CLKi. If Mi is 4, then CLKi is four times the frequency of BCLK and every fourth rising edge of CLKi is coincident with every rising edge of BCLK. For Mi=4, PREi is asserted before every $4^{th}$ rising edge of CLKi coincident with corresponding rising edges of BCLK. In general, PREi is asserted just before every $Mi^{th}$ rising edge of CLKi coincident with corresponding rising edges of BCLK.

The clock signals CLK1-CLKN and their corresponding preliminary signals PRE1-PREN are provided to respective inputs of a peak phase error detection circuit 107, which measures the peak phase error between any two clock signals. The peak phase error detection circuit 107 is controlled by test logic 109 via control (CTL) signals, and the test logic 109 interfaces an external test circuit (not shown) via test interface (TEST) signals and an external test interface 111. The external test interface 111 includes one or more test pins or the like of the device 100. The test logic 109 and external test interface 111 may be implemented according to any suitable test configuration, such as according to the JTAG (Joint Test Action Group) boundary scan interface. A calibration pulse signal CALPLS (FIG. 2) is either internally generated or is provided externally. In one embodiment, an external calibration signal CALPLSA is shown provided via the external test interface 111 and is used to derive CALPLS (directly or indirectly). In an alternative embodiment, CALPLS is generated internally and a corresponding calibration signal CALPLSB may be externally provided for purposes of accurately measuring the pulse width of CALPLS. In one embodiment, CALPLS is derived from any of the BCLK or CLK1-CLKN signals. As described further below, the CALPLS signal is used to calibrate timing of a delay line 209 (FIG. 2) for accurate phase error measurement.

Figure 2:
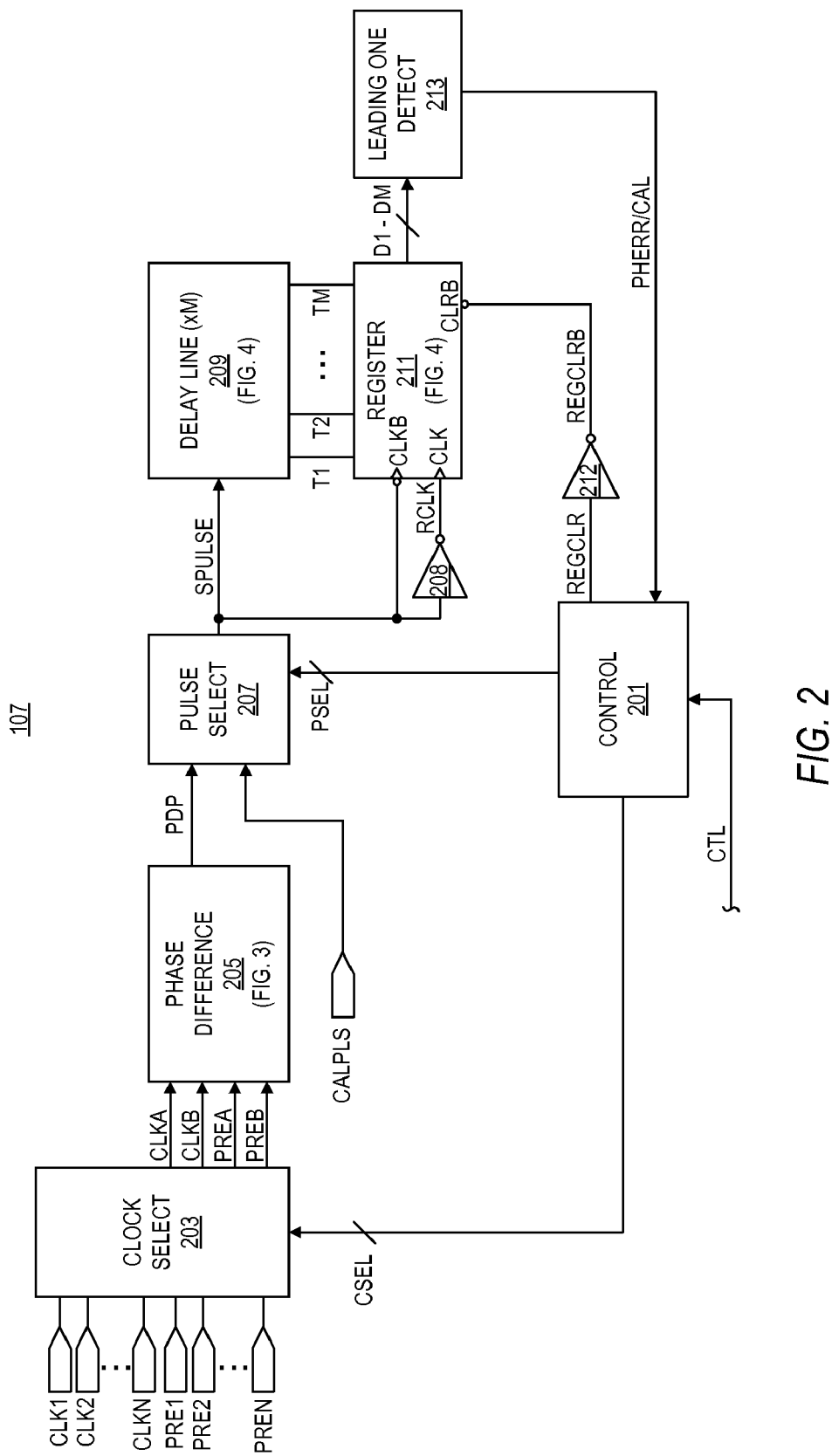
FIG. 2 is a block diagram of an exemplary embodiment of the peak phase error detection circuit of FIG. 1.

FIG. 2 is a block diagram of an exemplary embodiment of the peak phase error detection circuit 107 of FIG. 1. Control logic 201 interfaces the CTL signals and provides clock select signals CSEL to clock select logic 203. The clock select logic 203 has respective inputs receiving the CLK1-CLKN signals and corresponding preliminary signals PRE1-PREN, and respective outputs providing a pair of selected clock signals CLKA and CLKB and corresponding preliminary signals PREA and PREB. CLKA and CLKB are a selected pair of the clock signals CLK1-CLKN based on the CSEL signals, and PREA and PREB are the corresponding preliminary signals for the selected clock signals CLKA and CLKB, respectively.

In this manner, the control logic 201 selects any pair of the clock signals CLK1-CLKN to measure peak phase error between the selected clock signals. In one embodiment, the clock select logic 203 is implemented with one or more multiplexer (MUX) circuits or the like, although any suitable select logic configuration may be used. The selected clock signals CLKA and CLKB and the corresponding PREA and PREB signals are provided to respective inputs of phase difference logic 205, which has an output providing a phase difference pulse signal PDP to one input of pulse select logic 207. The CALPLS signal is provided to another input of the pulse select logic 207, which provides a selected pulse signal SPULSE to an input of the delay line 209. The control logic 201 asserts one or more pulse select signals PSEL to the pulse select logic 207 for selecting between PDP and CALPLS as the SPULSE signal provided to the delay line 209. In one embodiment, the pulse select logic 207 is implemented with at least one MUX circuit or the like, although any suitable select logic configuration may be used.

The delay line 209 provides an integer number "M" of tap signals T1-TM to respective inputs of register logic 211, which registers the tap signals T1-TM and provides M corresponding delay bits D1-DM to respective inputs of a leading one detect circuit 213. The leading one detect circuit 213 encodes or otherwise converts the delay bits D1-DM to provide a phase error signal PHERR or a calibration signal CAL depending upon the selected mode of operation. The PHERR or CAL signal is provided back to the control logic 201. In the illustrated embodiment, the SPULSE signal is provided to an inverted clock input CLKB of the register logic 211. The SPULSE signal is provided to an input of an inverter 208, having an output providing a register clock signal RCLK to a non-inverted clock input CLK of the register logic 211. The control logic 201 further provides a register clear signal REGCLR to an input of an inverter 212, having an output providing an inverted register clear signal REGCLRB to an inverted clear input CLRB of the register logic 211. In one embodiment, the CALPLS signal is a well-defined and precisely controlled pulse signal with known or measurable pulse width. Alternatively, the CALPLS signal is externally provided, such as via the external test interface 111 as previously described, so that it may be precisely measured by external test equipment for purposes of calibration. In one embodiment, the CALPLS signal is provided by a separate clock circuit (not shown). Alternatively, the CALPLS signal is any selected one of the BCLK and CLK1-CLKN clock signals. Regardless of the source of CALPLS, its pulse width, which is selected as its high time or its low time depending upon the configuration of the delay line 209, has a duration that is less than the relative delay through the delay line 209. In one embodiment, CALPLS is a "pulse" signal providing pulses with known or measured duration. Alternatively, the CALPLS is conveniently a clock signal with known frequency and duty cycle, such as any of the BCLK or CLK1-CLKN clock signals.

In operation of the peak phase error detection circuit 107, the control logic 201 asserts the REGCLR signal to clear the register logic 211 before performing calibration or before measuring peak phase error. In one embodiment, the control logic 201 holds the REGCLR signal high to clear or otherwise keep the register logic 211 cleared, and then pulls REGCLR low while a calibration or measurement is made. In one embodiment, REGCLR is held high until the control logic 201 has selected a different PDP or has switched between PDP and CALPLS and until any contaminants from previous calibration or measurement cycles have cleared out of logic 205, 207 and 209. The control logic 211 initiates a calibration mode by asserting the PSEL signal to select the CALPLS signal as the SPULSE signal provided to the input of the delay line 209. In one embodiment, the duration of the CALPLS signal while high is effectively measured through the delay line 209 for purposes of calibration. As described further below, in one embodiment the delay line 209 is configured as a series of delay cells having outputs providing the T1-TM tap signals, which are initially cleared to logic zero in response to the REGCLR signal. When the SPULSE goes high, the rising edge propagates through the delay cells causing the tap signals to change to logic one's one at a time from lowest (T1) to highest (TM). When the SPULSE goes back low, the number of leading one's ("1's") are registered and provided as the delay bits D1-DM to the leading one detect circuit 213. The leading edge detect circuit 213 encodes or otherwise converts the delay bits into the CAL value provided to the control logic 201. As described further below, the CAL value is the number of front-end delay cells that changed logic state from low to high in the delay line 209 and thus duration of high state of the CALPLS. Since the high state of the CALPLS is either known or measured, the delay of each delay cell is determined from the CAL value by dividing the known time or the measured time by the CAL value. In one embodiment, the control logic 201 is configured to perform calculations and report results externally. In another embodiment, the control logic 201 reports test results externally and calculations are performed externally, such as by the external test unit or by manual method.

The control logic 201 initiates a measurement mode by asserting the CSEL signals to select a pair of the clock signals CLK1-CLKN as CLKA and CLKB and corresponding preliminary signals PREA and PREB, and then by asserting the PSEL signals to select the PDP signal as the SPULSE signal provided to the input of the delay line 209. The phase difference logic 205 asserts a pulse on the PDP signal having a duration which is the phase error between the selected clock signals. The PDP signal is provided as the SPULSE signal to the delay line 209 for measuring the duration of the PDP pulse and thus determining the phase error between the selected clock signals. When PDP goes high, the rising edge of SPULSE propagates through the delay cells causing the tap signals to rise one at a time. When the PDP pulse goes back low, the number of leading one's ("1's") are registered and provided as the delay bits to the leading one detect circuit 213. The leading edge detect circuit 213 encodes or converts the delay bits into the PHERR value in a similar manner as described for calibration, and PHERR is provided to the control logic 201. The PHERR value is the number of front-end delay cells of the delay line 209 which switched state for the duration of the PDP pulse. Since the delay of each delay cell in the delay line 209 was determined during calibration, and since the PHERR value represents the phase error as the number of delay cells switched from low to high, the phase error between the selected clock signals is determined by multiplying the PHERR value by the delay cell time. The control logic 201 reports results to an external test unit (not shown) via the test logic 109. In one embodiment, the control logic 201 is configured to perform calculations and report results externally. In another embodiment, the control logic 201 reports test results externally and calculations are performed externally, such as by the external test unit or by manual method.

Figure 3:
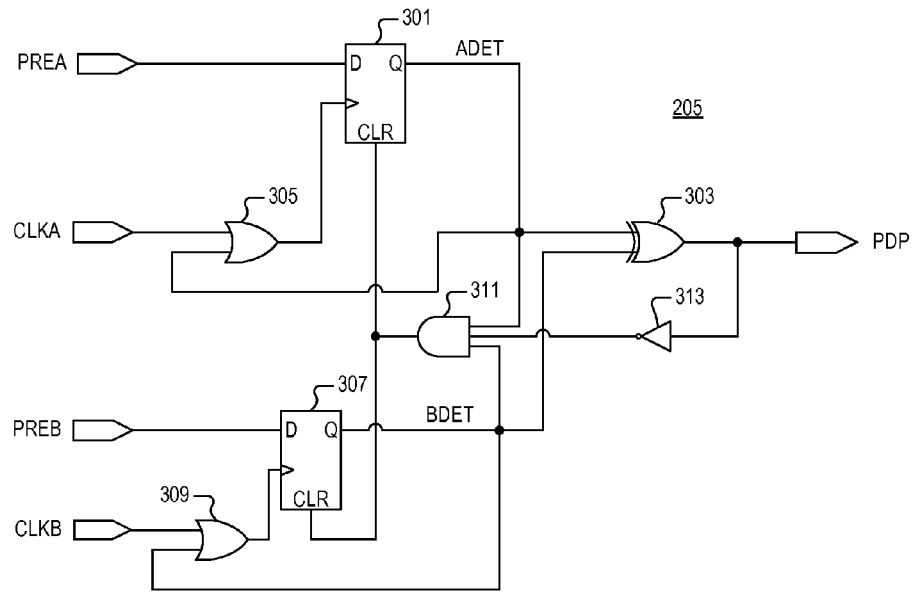
FIG. 3 is a schematic diagram of an exemplary embodiment of the phase difference logic of FIG. 2.

FIG. 3 is a schematic diagram of an exemplary embodiment of the phase difference logic 205 of FIG. 2. The PREA signal is provided to the D input of a D-type flip-flop (DFF) 301, which provides a first clock edge detect signal ADET signal at its Q output. ADET is provided to one input of a two-input exclusive-OR (XOR) gate 303, to one input of a two-input OR gate 305, and to one input of a three-input AND gate 311. The CLKA signal is provided to the other input of the OR gate 305, which has its output coupled to the clock input of the DFF 301. The PREB signal is provided to the D input of another DFF 307, which provides a second clock edge detect signal BDET at its Q output. BDET is provided to the other input of the XOR gate 303, to one input of another two-input OR gate 309, and to another input of the AND gate 311. The CLKB signal is provided to the other input of the OR gate 309, which has its output coupled to the clock input of the DFF 307. The output of the XOR gate 303 provides the PDP signal, which is further provided to the input of an inverter 313. The output of the inverter 303 is provided to the third input of the AND gate 311. The output of the AND gate is provided to the clear input CLR of each of the DFFs 301 and 307.

In operation of the phase difference logic 205, the ADET and BDET signals are both initially low so that the XOR gate 303 initially asserts PDP low. The PREA and PREB signals are asserted high when the next rising edges of the CLKA and CLKB signals are both supposed to be coincident with the next rising edge of BCLK. Thus, PREA is asserted high before CLKA next goes high and PREB is asserted high before CLKB next goes high, and the CLKA and CLKB signals are both supposed to go high at about the same time. When CLKA goes high, the logic high state of PREA is clocked through the DFF 301 pulling ADET high. Similarly, when CLKB goes high, the logic high state of PREB is clocked through the DFF 307 pulling BDET high. If CLKA and CLKB go high at the same time, then ADET and BDET are also asserted high at the same time so that the XOR gate 303 does not change state and PDP remains low. In that case there is little or no phase error between the selected clock signals CLKA and CLKB. Also, if the CLKA and CLKB do not go high at exactly the same time but within a negligible time with respect to each other, then either no pulse or a negligible pulse appears on PDP and the DFFs 301 and 307 may both be cleared if all inputs to the AND gate 311 are high at the same time. When there is phase error between CLKA and CLKB, then one of the ADET or BDET signals go high while the other remains low so that the XOR gate 303 pulls PDP high. PDP remains high until both ADET and BDET are both asserted high, at which time the PDP is pulled back low. As soon as PDP is pulled back low while ADET and BDET are both high, then the AND gate 311 resets both DFFs 301 and 307 to reset the circuit. In this manner, the duration of the pulse on PDP represents the phase difference or phase error between CLKA and CLKB.

Figure 4:
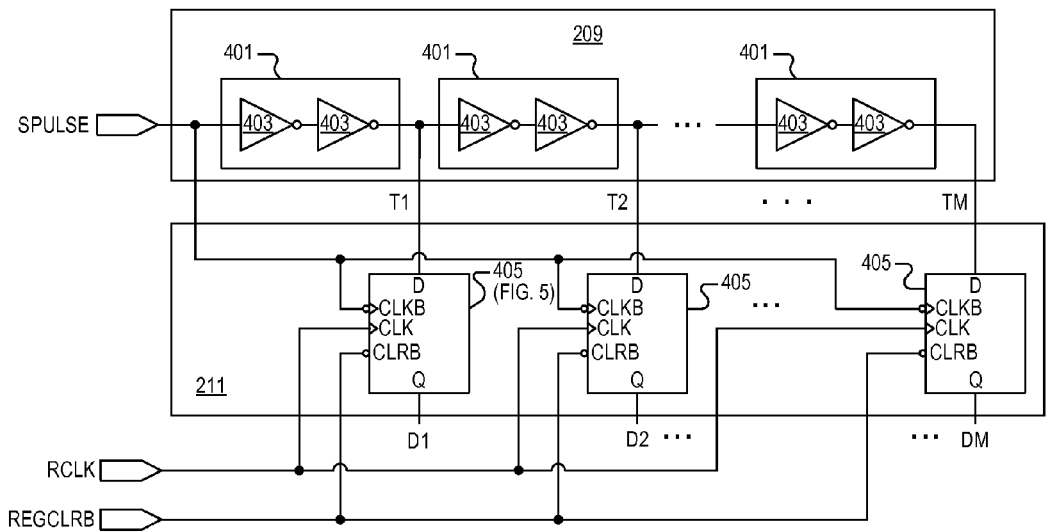
FIG. 4 is a schematic diagram of the delay line coupled to the register logic of FIG. 2 according to one embodiment.

FIG. 4 is a schematic diagram of the delay line 209 of FIG. 2 coupled to the register logic 211 of FIG. 2 according to one embodiment. In the illustrated embodiment, the delay line 209 includes M delay cells 401 coupled together in series. Each delay cell 401 includes a pair of series-coupled inverters 403, so that the delay line 209 collectively includes 2M inverters 403 coupled in series. In one more specific embodiment, M is 64 so that there are 128 series-coupled inverters, although M may be any suitable number for a given configuration. The inverters 403 are configured in substantially identical manner providing a substantially equal delay for each delay cell 401. Although inverters are illustrated, alternative delay elements may be used, such as buffers or delay cells or the like. The SPULSE signal is provided to an input of a first delay cell 401, which has an output providing a first tap signal T1. T1 is provided to the input of a second delay cell 401, having an output providing the second tap signal T2, and so on up to a last delay cell 401 providing the last tap signal TM.

Each of the tap signals T1-TM is provided to the data (D) input of a corresponding one of a series of registers 405 of the register logic 211. The Q outputs of the registers 405 provide the delay bits D1-DM to respective inputs of the leading one detect circuit 213. The SPULSE signal is provided to the inverted clock input CLKB of each register 405, the RCLK signal is provided to the non-inverted clock input CLK of each register 405, and the REGCLRB signal is provided to the inverted clear input CLRB of each register 405.

In operation, when the SPULSE signal goes high, RCLK is asserted low and each register 405 of the register logic 211 is prepared to register the tap signals T1-TM. The rising edge of SPULSE propagates through each delay cell 401 one at a time causing the tap signals T1 to TM to change from a logic zero to a logic one starting with T1 and ending with TM. When the SPULSE signal goes back low, the registers 405 latch the current state of the tap signals T1-TM as the delay bits D1-DM provided to the leading one detect circuit 213. For example, if the first three delay bits D1-D3 are logic one and the remaining delay bits D4-DM are logic zero (11100000, . . . ,0), then the duration of the SPULSE signal is approximately three delay cell times in duration. Or, if the first 15 delay bits D1-D15 are logic one and the remaining delay bits D16-DM are logic zero (111111111111111110000, . . . ,0), then the duration of the SPULSE signal is approximately fifteen delay cell times in duration. The number of leading logic ones indicates the duration of SPULSE through the delay line 209. Since the delay through each delay cell 401 is determined during calibration and since the delay cells have substantially equal delay, the collective state of the delay bits D1-DM represents the duration of the SPULSE signal while high. The leading one detect circuit 213 encodes or converts the delay bits D1-DM into the number of leading ones, where the determined number is provided as the PHERR value to the control logic 201. Conceptually, the PHERR value multiplied by the delay time of each of the delay cells 401 is the duration of the SPULSE, which is the phase error between the selected clock signals.

Figure 5:
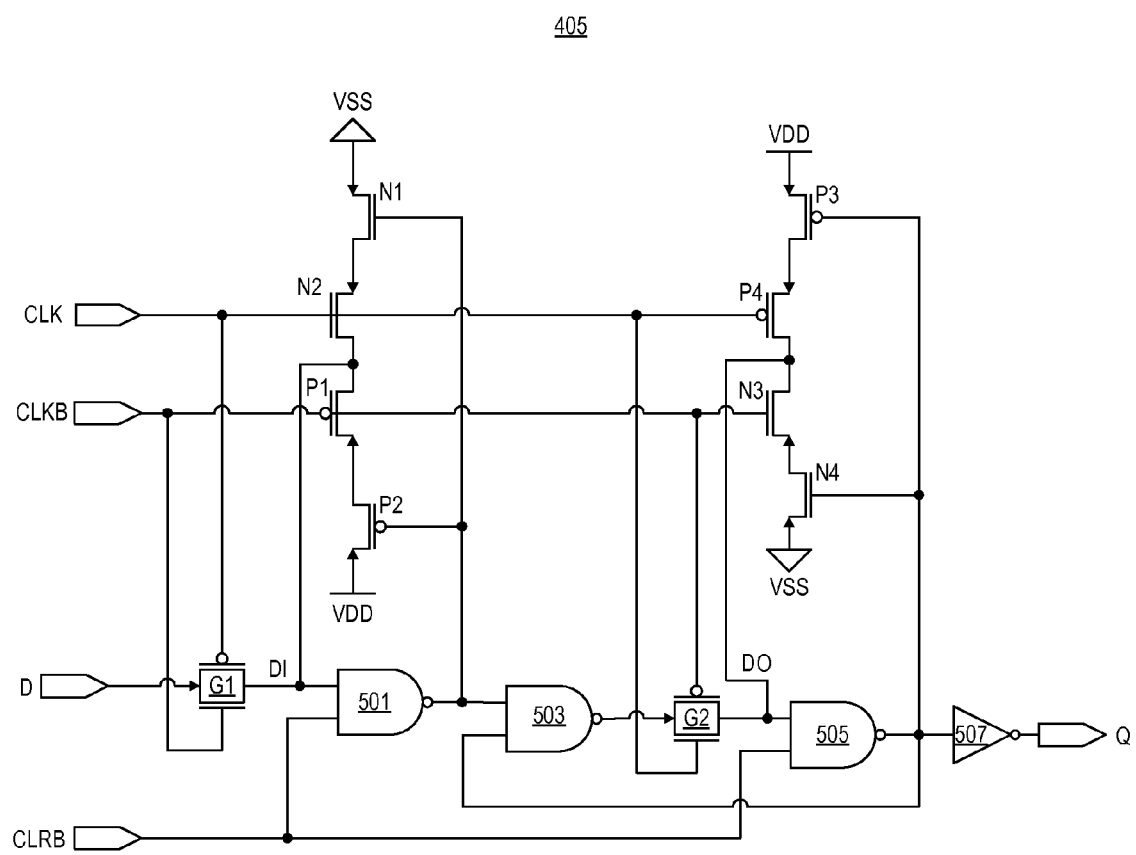
FIG. 5 is a schematic diagram of the register of FIG. 4 according to one embodiment.

FIG. 5 is a schematic diagram of an exemplary embodiment of the register 405 of FIG. 4. The CLK input is provided to the gate of an N-channel device N2, to the gate of a P-channel device P4, to an inverting gate of a pass device G1, and to a non-inverting gate of another pass device G2. Each pass device G1 and G2 is configured as a P-channel device and an N-channel device coupled together in which the gate of the P-channel device serves as the inverting gate and the gate of the N-channel device as the non-inverting gate of the respective pass device. The CLKB input is provided to the gate of a P-channel device P1, to the gate of an N-channel device N3, to the non-inverting gate of the pass device G1, and to the inverting gate of the pass device G2. The D input is provided to the input of the pass device G1. The CLRB input is provided to one input of each of two two-input NAND gates 501 and 505. The output of the pass device G1, which develops a signal D1, is coupled to the other input of the NAND gate 501 and to the drains of N2 and P1. The output of NAND gate 501 is coupled to one input of another two-input NAND gate 503, to the gate of a P-channel device P2 and to the gate of an N-channel device N1. The devices N1, N2, P1 and P2 are coupled in a stacked configuration between source voltages VSS and VDD. In particular, the source of N1 is coupled to VSS and the drain of N1 is coupled to the source of N2. The drain of N2 is coupled to the drain of P1, which has its source coupled to the drain of P2. The source of P2 is coupled to VDD. The output of NAND gate 503 is coupled to the input of pass device G2, and the output of G2, which develops a signal DO, is coupled to the other input of NAND gate 505 and to the drains of N3 and P4. The output of NAND gate 505 is coupled to the input of an inverter 507, to the gate of an N-channel device N4, to the gate of a P-channel device P3, and to the other input of the NAND gate 503. The devices P3, P4, N3 and N4 are coupled in a stacked configuration between VSS and VDD. In particular, the source of P3 is coupled to VDD and the drain of P3 is coupled to the source of P4. The drain of P4 is coupled to the drain of N3, which has its source coupled to the drain of N4. The source of N4 is coupled to VSS. The output of the inverter 507 provides the Q output of the register 405.

In operation of the register 405, when the control logic 201 asserts REGCLR high, the CLRB input is asserted low causing the NAND gates 501 and 505 to assert their outputs high, which causes the NAND gate 503 to pull its output low. The Q output of the register 405 at the output of the inverter 507 is thus pulled low while REGCLR is high. In this manner, the control logic 201 clears and keeps the register logic 211 clear while holding REGCLR high. If SPULSE is low, then the CLK input is high and the CLKB input is low. The devices N1 and N2 are both turned on so the D1 signal is pulled low. The pass device G1 is off so that the D input is initially isolated, whereas the pass device G2 is on so that the low output of the NAND gate 503 pulls the DO signal low. When the control logic 201 asserts REGCLR back low while SPULSE is low, the state of the register 405 remains unchanged so that the Q output remains low. When SPULSE goes high to initiate the next pulse (for calibration or for phase error delay), the CLK input goes low and the CLKB input goes high. The pass device G1 is turned on so that D1 signal is pulled to the state of the D input while SPULSE remains high. Also, the pass device G2 is turned off so that the Q output is temporarily isolated from the input until SPULSE goes back low. The NAND gates 501 and 503 operate like inverters of the D input value while SPULSE is high (and while CLRB is high) so that the output of the NAND gate 503 reflects the D input.

When the SPULSE goes back low, the pass device G1 turns off to isolate the D input and the pass device G2 turns on to pass the stored input value to the input of the NAND gate 505. The NAND gate 505 acts as an inverter so that the output of the inverter 507 asserts the Q output to the stored value of the D input. If the D input is still low when SPULSE goes back low, then the low output of the NAND gate 503 is inverted by NAND gate 505, and the high output of the NAND gate 505 is inverted by inverter 507 so that Q remains low. Furthermore, if the D input is still low when SPULSE goes back low, then the devices N1 and N2 are turned on to effectively "register" the output of the NAND gate 501 high while SPULSE remains low. Since the pass device G2 is on, the output of the NAND gate 505 also remains high so that the Q output is effectively latched low.

If the D input goes high at any time while SPULSE is high, then the output of the NAND gate 501 goes low which pulls the output of NAND gate 503 high. When SPULSE goes low, the devices P1 and P2 are both turned on to keep the input of the NAND gate 501 high so that the output of the NAND gate 501 is effectively latched low and the output of the NAND gate 503 is latched high. The pass device G2 is turned on to pull the DO signal high so that the output of the NAND gate 505 is pulled low. The inverter 507 pulls the Q output high, which is passed as a logic one to the leading one detect circuit 213. The low edge of the SPULSE signal propagates through the delay line 209 so that the D input eventually goes back low. If the control logic 201 asserts the REGCLR high, then operation repeats in similar manner for the next pulse of SPULSE. If, however, the Q output of the register 405 is high and the register 405 is not cleared for the next rising edge of SPULSE, then the Q output remains high regardless of the state of the D input. Assume, for example, that the D input is low when the Q output is high and the SPULSE signal goes high again. The logic zero D input is passed by the pass device G1 to the D1 signal at the input of the NAND gate 501, which switches its output high again. Since the output of the NAND gate 505 is low and since the CLK input is low, the devices P3 and P4 keep one input of the NAND gate 505 high and the CLRB input keeps the other input of the NAND gate 505 high, so that its output remains latched low. In this manner, the Q output of the register 505 remains latched high regardless of the D input until the register 405 is cleared by the control logic 201.

The register 405 operates in a similar manner as a set-reset (SR) type register or flip-flop. The "D" input of the register 405 acts as the "set" input and the "CLRB" input acts as the reset input. In either case, once the register is set, it is not cleared until being reset. During a calibration cycle, the array of registers stores and provides the duration of the calibration pulse signal CALPLS, or the high value of a calibration clock signal, in which the CAL value is used to determine the delay of each delay cell 401. During a measurement period which includes multiple measurement cycles, the array of registers provides the longest duration pulse value so that the PHERR value represents the peak phase error between the selected clock signals.

Referring back to FIGS. 2 and 4, after a calibration cycle, the control logic 201 clears the register logic 211 and selects a pair of input clock signals CLK1-CLKN as the CLKA/CLKB clock signals for peak phase error measurement. The PSEL signal is asserted to select PDP, which is provided as the SPULSE to the delay line 209. Multiple cycles of the selected clock signals CLKA and CLKB are processed through and measured by the delay line 209 without re-clearing the register logic 211. In this manner, even if various pulse durations are input to the delay line 209, only the pulse with the greatest duration is measured so that the peak phase error is determined. For example, if a first pulse is relatively short and only sets the first five registers 405 of the register logic 211, then the delay bits are initially set to 111110000, . . . ,0. The PHERR value, if sampled by the control logic 201 after this first pulse, is 5. If the next pulse is longer so that the first ten registers 405 are set, then the delay bits change to 1111111111000, . . . ,0. The PHERR value, if sampled by the control logic 201 after this second pulse, is now 10. If the next pulse is shorter than 10 delay cells such that less than the first ten registers 405 are affected, then the delay bits do not change and remain at 1111111111000, . . . ,0. Thus, the PHERR value, if sampled by the control logic 201 after this third pulse, remains at a value 10 even though a shorter duration pulse was input to the delay line 209. Each register 405, once set, remains set until cleared, so that only the maximum duration pulse through the delay line 209 is detected by the register logic 211 to reflect the peak phase error. After a measurement period of multiple clock cycles are measured, if the longest duration pulse was still 10, then the PHERR value is 10 and reflects the peak phase error determined during the measurement period. If instead any pulse is greater than 10 delay cells, such as 20, then the PHERR value is 20 and shorter duration pulses do not change the maximum PHERR value during the same measurement period. The control logic 201 asserts the REGCLR signal to clear the register logic 211 to initiate a new measurement period or to conduct a new calibration cycle.

Figure 6:
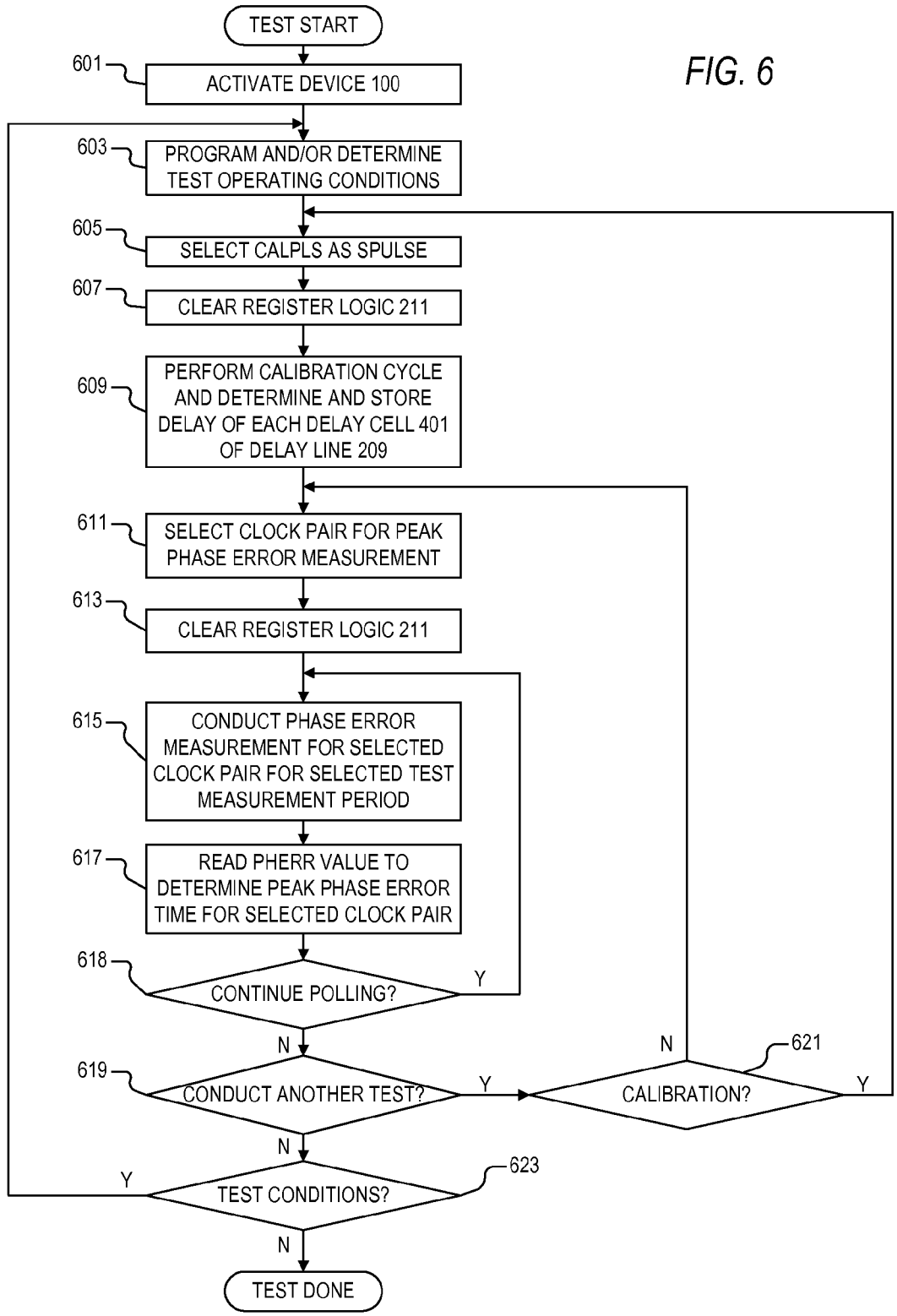
FIG. 6 is a flowchart diagram illustrating an exemplary test procedure for the integrated device of FIG. 1 using the peak phase error detection circuit 107 according to one embodiment.

FIG. 6 is a flowchart diagram illustrating an exemplary test procedure for the device 100 using the peak phase error detection circuit 107 according to one embodiment. The device 100 is mounted to or otherwise coupled to a test station (not shown) via the external test interface 111 for purposes of conducting phase error test. At first block 601, the device 100 is activated so that the BCLK begins oscillating at its nominal frequency level. At next block 603, any test operating conditions are programmed or otherwise determined. For example, any adjustments to operating frequency of BCLK are made, and the multipliers M1-MN are programmed or otherwise determined if not otherwise known. The actual frequencies of the BCLK and CLK1-CLKN may be measured or otherwise determined to ensure test accuracy. Other test operating conditions may be adjusted or otherwise determined at block 603, such as source voltages and currents, core voltages and currents, any temperature conditions, input clock jitter, etc. Any particular operating parameters of the PLLs 103 may be adjusted or determined, such as bias currents and charge currents and the like at block 603.

At next block 605, the control logic 201 asserts the PSEL signals to select CALPLS as SPULSE provided to the delay line 209 for purposes of calibration. At next block 607, the control logic 201 clears the register logic 211. The register logic 211 may be held in a cleared state until the pulse select logic 207 settles or the register logic 211 is cleared after the pulse select logic 207 is settled. In either case, the register logic 211 is cleared until SPULSE accurately reflects CALPLS. At next block 609, the control logic 201 performs a calibration cycle evaluating CALPLS through the delay line 209. The CAL value at the output of the leading one detect circuit 213 is determined after at least one full pulse of CALPLS is provided through the delay line 209. Multiple pulses of CALPLS may be provided through the delay line 209 before determining the CAL value. Then the CAL value is stored and evaluated to determine the relative delay of each delay cell 401 of the delay line 209 as previously described. At next block 611, the control logic 201 asserts the CSEL signals to select a pair of the clock signals CLK1-CLKN for peak phase error measurement and asserts the PSEL signals for selecting the PDP output as the SPULSE signal to the delay line 209. At next block 613, the control logic 201 clears the register logic 211. At block 613, the register logic 211 is either held in a cleared state or is cleared when SPULSE accurately reflects PDP. At next block 615, the control logic 201 conducts a phase error measurement test of the selected clock signals.

At next block 617, the control logic 210 reads the PHERR value to determine the results of the phase error measurement test of the selected clock signals. The results may be stored or otherwise reported to external test equipment. It is noted that the control logic 201 may monitor and/or store and report the PHERR value after each clock cycle or after any selected number of clock cycles during testing. At next block 618, it is queried whether to continue polling the PHERR value. If so, operation loops back to block 615 to conduct another phase error measurement for the selected clock pair. After a sufficient period of time or after a certain minimum number of clock test cycles, the PHERR value stabilizes at a peak value indicative of the peak phase error between the selected clock signals. In one embodiment, the measurement period is selected with sufficient duration to measure a suitable number of clock cycles of the selected clock signals. Any suitable number of clock cycles may be chosen and this number may be adjusted depending upon the test criterion or parameters. The PHERR value multiplied by the time per delay cell 401, which was determined during the calibration process, provides the peak phase error between the selected clock signals. Operation may loop between blocks 615-618 as long as desired in which the PHERR signal may be read and stored or reported as often as desired to detect any changes over time. The comparisons for the same clock pair may be run continuously as long as the clocks are running.

After the test for the selected clock pair is complete, operation proceeds to block 619 to query whether to conduct another test between the same pair or another pair of clock signals for the given test conditions. If so, operation proceeds to block 621 to query whether another calibration cycle should be performed before initiating another test measurement period. If so, operation returns to block 605 to select CALPLS for performing another calibration cycle for the delay line 209. It is desired to conduct a calibration cycle on a regular basis or after a selected time period to ensure accurate results. If it is decided not to perform a calibration cycle at block 621, operation proceeds instead to block 611 to select the same or a next pair of clock signals for testing. Referring back to block 619, if there are no more clock pairs to test for the given test conditions, operation proceeds instead to block 623 to query whether additional testing is to be performed under a different set of test conditions or otherwise to determine the exiting test conditions. As an example, it may be desired to modify or adjust clock speeds, temperatures, voltages, currents, etc., or it may be decided to re-evaluate existing test conditions. If so, operation proceeds back to block 603. Otherwise, test operation is completed.

The peak phase error determination is made between any two of the clock signals CLK1-CLKN and may be made for each possible clock pair combination. It is beneficial to at least determine phase error between a pair of clocks provided to two different ones of the clock domains CD1-CDN which communicate with each other. If the peak phase error is sufficiently high to jeopardize proper operation of the device 100, then the operation of any one or more of the PLLs 103 may be adjusted to ensure proper operation. Such adjustments may include, for example, clock speed adjustments, current adjustments (e.g., source or bias currents or the like), voltage adjustments, etc.

Although the present invention has been described in considerable detail with reference to certain preferred versions thereof, other versions and variations are possible and contemplated. For example, the circuits described herein may be implemented in any suitable manner including logic devices or circuitry or the like. Any number of the functions described for the logic circuits may be implemented in software or firmware within an integrated device. Those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A phase error circuit, comprising:
   phase difference logic which provides a pulse difference signal comprising at least one difference pulse indicative of a timing difference between selected edges of a pair of clock signals; and
   delay and register logic having an input receiving said pulse difference signal and an output providing a phase error value representing a duration of said at least one difference pulse, said delay and register logic comprising:
   a delay line comprising a plurality of delay cells coupled in series forming a corresponding plurality of taps; and
   a plurality of registers, each having a data input coupled to a corresponding one of said plurality of taps and each having a clock input coupled to a common clock node which transitions coincident with a trailing edge of each of said at least one difference pulse.

2. The phase error circuit of claim 1, wherein said at least one difference pulse comprises a plurality of difference pulses, wherein said plurality of registers collectively register a state of said plurality of taps as a plurality of delay bits in response to each trailing edge of said plurality of difference pulses, wherein each of said plurality of registers remains set until reset, and wherein said plurality of registers collectively store a peak phase error value indicative of a longest one of said plurality of difference pulses.

3. The phase error circuit of claim 1, wherein said plurality of registers comprises a plurality of set-reset registers each having a set input coupled to a corresponding one of said plurality of taps, a reset input for clearing said plurality of registers, and at least one clock input responsive to transitions of said at least one difference pulse.

4. The phase error circuit of claim 1, further comprising a leading one detect circuit having inputs coupled to outputs of said plurality of registers and an output providing said phase error value.

5. The phase error circuit of claim 1, further comprising:
pulse select logic which selects between said pulse difference signal and a calibration pulse signal for providing a selected pulse signal to said delay line; and
control logic which controls said pulse select logic to select said calibration pulse signal to calibrate said delay line and to select said pulse difference signal to determine phase error between said pair of clock signals.

6. The phase error circuit of claim 5, wherein said plurality of delay cells are configured to have substantially the same delay, and wherein said same delay through each of said plurality of delay cells is determined by dividing known time of said calibration pulse by said phase error value.

7. The phase error circuit of claim 1, wherein said phase difference logic comprises:
a first detect circuit which transitions a first detect signal when a first one of said pair of clock signals is designated to transition coincident with a clock edge;
a second detect circuit which transitions a second detect signal when a second one of said pair of clock signals is designated to transition coincident with said clock edge; and
exclusive OR logic having inputs receiving said first and second detect signals and an output providing said pulse error signal.

8. An integrated circuit, comprising:
a plurality of clock circuits, each providing a corresponding one of a plurality of clock signals; and
a phase error circuit, comprising:
phase difference logic which receives a selected pair of said plurality of clock signals and which provides a pulse difference signal comprising at least one difference pulse indicative of a timing difference between said selected pair of clock signals;
delay and register logic having an input receiving said pulse difference signal and an output providing a phase error value representing a duration of said at least one difference pulse, said delay and register logic comprising:
a delay line comprising a plurality of delay cells coupled in series forming a corresponding plurality of taps; and
a plurality of registers, each having a data input coupled to a corresponding one of said plurality of taps and each having a clock input coupled to a common clock node which transitions coincident with a trailing edge of each of said at least one difference pulse; and
control logic for selecting said selected pair of clock signals from among said plurality of clock signals.

9. The integrated circuit of claim 8, wherein each of said plurality of clock circuits comprises:
a phase-locked loop circuit receiving a reference clock and a clock multiplier and providing a corresponding one of said plurality of clock signals and a corresponding one of a plurality of preliminary signals; and
wherein each of said plurality of preliminary signals is asserted by a corresponding phase-locked loop circuit when a next edge of said corresponding clock signal is intended to be coincident with an edge of said reference clock.

10. The integrated circuit of claim 9, wherein said phase difference logic comprises:
a first detect circuit which transitions a first detect signal when a first one of said selected pair of clock signals transitions while a corresponding first preliminary signal is asserted;
a second detect circuit which transitions a second detect signal when a second one of said selected pair of clock signals transitions while a corresponding second preliminary signal is asserted; and
exclusive OR logic having inputs receiving said first and second detect signals and an output providing said pulse error signal.

11. The integrated circuit of claim 8, wherein said at least one difference pulse comprises a plurality of difference pulses,
wherein said plurality of registers collectively latch a state of said plurality of taps as a plurality of delay bits in response to each trailing edge of said plurality of difference pulses, wherein each of said plurality of registers remains set until reset, and wherein said plurality of delay bits collectively store a peak phase error value indicative of a longest one of said plurality of difference pulses.

12. The integrated circuit of claim 11, further comprising a leading one detect circuit having inputs coupled to corresponding outputs of said plurality of registers and an output providing said phase error value.

13. The integrated circuit of claim 8, further comprising:
pulse select logic which selects between said pulse difference signal and a calibration pulse signal for providing a selected pulse signal to said delay line;
wherein said plurality of delay cells are configured to have substantially the same delay; and
wherein said control logic controls said pulse select logic to select said calibration pulse signal to calibrate said delay line in which said same delay through each of said plurality of delay cells is determined by dividing known time of said calibration pulse by said phase error value.

14. The integrated circuit of claim 13, wherein phase error between said selected pair of clock signals is determined by multiplying said same delay by said phase error value.

15. The integrated circuit of claim 8, further comprising an external interface and test logic coupled to control said control logic.

16. The integrated circuit of claim 8, wherein said plurality of clock circuits and said phase error circuit are provided on a microprocessor.

17. A method of measuring phase error between clock signals, comprising:
- logically comparing a pair of clock signals at selected clock edges and providing at least one timing difference pulse;
- providing the at least one timing difference pulse through a delay line with a plurality of taps;
- registering a state of each of the plurality of taps to provide a corresponding plurality of delay bits at a trailing edge of each of the at least one timing difference pulse, wherein each registered plurality of delay bits indicates a duration of a corresponding one of the at least one timing difference pulse; and
- converting the plurality of delay bits to a phase error value.

18. The method of claim 17, wherein said logically comparing a pair of clock signals comprises asserting each timing difference pulse while the pair of clock signals are different during a clock edge intended to be coincident.

19. The method of claim 17, wherein said providing at least one timing difference pulse through a delay line comprises providing each timing difference pulse through a plurality of delay cells coupled in series.

20. The method of claim 17, wherein said at least one timing difference pulse comprises a plurality of consecutive timing difference pulses, wherein said registering a state of each of the plurality of taps comprises setting a corresponding one of a plurality of latches in which each latch remains set for the duration of a longest one of the plurality of timing difference pulses, and wherein said phase error value comprises a peak phase error value.

21. The method of claim 17, wherein said converting the plurality of delay bits to a phase error value comprises determining a number of leading ones of the plurality of delay bits.

* * * * *